July 3, 1962 N. P. GLUTH 3,042,800

SELECTIVE AUTOMATIC GAIN CONTROL CIRCUIT

Filed July 1, 1960 5 Sheets-Sheet 1

INVENTOR.
NORMAN P. GLUTH,
BY Noel B. Hammond
AGENT.

INVENTOR.
NORMAN P. GLUTH,
BY Noel B. Hammond
AGENT.

SELECTIVE AUTOMATIC GAIN CONTROL CIRCUIT

Filed July 1, 1960 5 Sheets-Sheet 3

INVENTOR.
NORMAN P. GLUTH,
BY Noel B. Hammond
AGENT.

July 3, 1962 N. P. GLUTH 3,042,800

SELECTIVE AUTOMATIC GAIN CONTROL CIRCUIT

Filed July 1, 1960 5 Sheets-Sheet 4

INVENTOR.
NORMAN P. GLUTH,
BY Noel B. Hammond
AGENT.

INVENTOR.
NORMAN P. GLUTH,
BY Noel B. Hammond
AGENT.

United States Patent Office 3,042,800

Patented July 3, 1962

3,042,800

SELECTIVE AUTOMATIC GAIN CONTROL CIRCUIT

Norman P. Gluth, Orange County, Calif., assignor to Hughes Aircraft Company, Culver City, Calif., a corporation of Delaware Filed July 1, 1960, Ser. No. 40,285
4 Claims. (Cl. 325—402)

The present invention relates to AGC (automatic gain control) circuits for digital communication receivers and, more particularly, to a circuit for deriving an AGC voltage only from a redundant, multi-channel pulse signal having a predetermined pattern, the circuit being nonresponsive to noise, interfering signals, or redundant pulse signals having patterns other than the predetermined pattern.

AGC circuits are provided in radio receivers to maintain the amplitude of the output signal from the receiver constant even though the received radio signal may vary in amplitude. This is accomplished by rectifying and filtering the receiver signal and applying it as a D.C. (direct-current) bias voltage to amplifier circuits in the receiver to decraese the gain or amplification factor of these circuits when the amplitude of the received signal increases.

Radio receivers that receive a signal composed of a plurality of pulses transmitted in different subcarrier frequency channels derive AGC voltage either from the signal pulses in one of the channels or from the sum of the AGC voltages produced from the signal pulses in each of the channels. Such AGC circuits have the disadvantage that, in the presence of an interfering radio signal or noise, the AGC circuit cannot distinguish the noise or interfering signal from the desire dsignal and produces an AGC voltage that reduces the gain of the receiver even though the desired signal may be of low amplitude. Some multi-channel communication receivers are designed to receive a redundant pulse signal having a unique pulse occurrence pattern in the different subcarrier frequency channels as a function of time. It would be advantageous if such receivers could distinguish the desired signal from interferring signals or noise and produce an AGC voltage that is a function of the amplitude of only the desired signed.

Accordingly, it is an object of the present invention to provide a circuit for producing an automatic grain control voltage in response to a series of pulses initiated at different times.

Another object of the invention is the provision of a circuit for recognizing a multi-channel signal having a unique time versus frequency pattern.

Yet another object of the invention is to provide a circuit responsive to a multi-channel signal for developing an output signal having a repetition period proportional to the information signaling rate of the received signal.

A further object of the present invention is the provision of a circuit for combining a plurality of pulses initiated at different times and having predetermined polarities into a sinusoidal wave.

A still further object of the invention is to provide a communications receiver for multi-channel digital pulses having an automatic gain and automatic phase control circuit responsive solely to a predetermined input signal.

In accordance with these and other objects of the invention, a multi-channel radio receiver is provided with means for combining a plurality of trains of pulses to derive a composite fundamental periodic wave component having a period proportional to the repetition rate of the pulses. Resonant means tuned to a predetermined frequency is coupled to the output of the combining means for developing a sine wave in response to the composite fundamental periodic wave components, when the period of the composite wave corresponds to the frequency of the resonant means. The sine wave produced by the resonant means is rectified and filtered and applied to amplifier circuits in the radio receiver as an automatic gain control voltage. In addition, the sine wave is amplitude-limited and amplified to provide a square wave that is applied to the timing circuits of the communications receiver to provide automatic phase control of the timing signals of the receiver, thus providing synchronization with the received signal.

The following specification and the accompanying drawings respectively describe and illustrate an exemplification of the present invention. Consideration of the specification and the drawings will provide a complete understanding of the invention, including the novel features and objects thereof. Like reference characters are used to designate like parts throughout the figures of the drawings.

Figure 1:
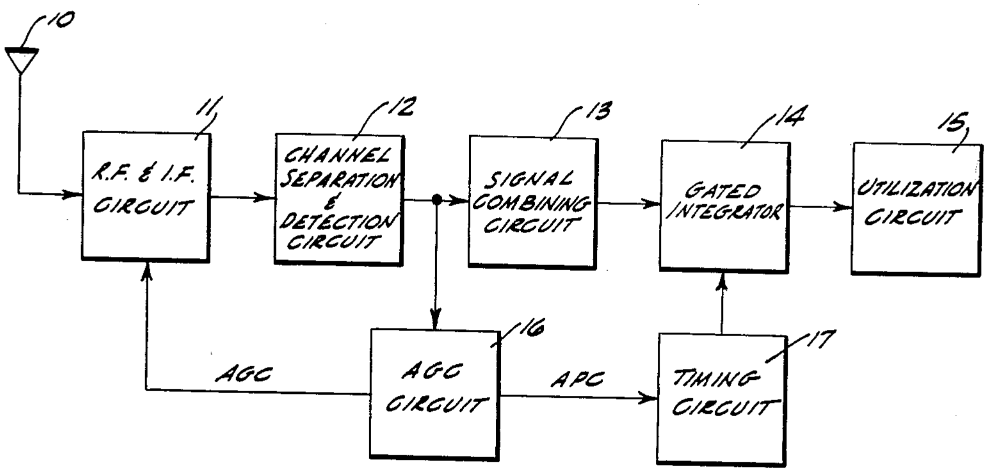
FIG. 1 is a block diagram of an exemplary embodiment of a radio receiver employing an AGC (automatic gain control) circuit in accordance with the present invention.

Referring now to FIG. 1 of the drawings, there is shown a multi-channel radio receiver incorporating an automatic gain control circuit of the present invention. An antenna 10 is provided to intercept radio signals and is connected to an RF and IF (radio frequency and intermediate frequency) circuit 11 for selection, frequency conversion and amplification of a received signal composed of a plurality of subcarrier signals. The output of the RF and IF circuit 11 is connected to the input of a channel separation and detection circuit 12 where signal pulses at the subcarrier frequencies are separated according to frequency and demodulated to produce multi-channel unipolar output pulses and are applied to the input of a signal combining circuit 13. The redundant multi-channel pulses are combined into a single pulse train that is applied to the input of a gated integrator 14. The gated integrator 14 develops an output signal indicative of whether the received signal represents a binary "one" or "zero," that is, a radiotelegraph "mark" or "space" symbol. The output signal of the gated integrator 14 is applied to a utilization circuit 15 which may be, for example, a teletypewriter.

The multi-channel output pulses from the channel separation and detection circuit 12 is also applied to an AGC (automatic gain control) circuit 16 which, in response to pulses having a predetermined pattern, provides an AGC voltage that is applied to the RF and IF circuit 11, and also provides an APC (automatic phase control) voltage that is applied to a timing circuit 17. The timing circuit 17 is a pulse generator that develops periodic gating pulses that are applied to the gated integrator 14. The APC voltage from the AGC circuit 16 is employed to synchronize the generation of the gating pulses in the timing circuit 17 with the received signal.

To provide a complete understanding of the AGC circuit of the present invention, the radio receiver will be described in detail, inasmuch as this type of receiver is not widely known at present.

Figure 2:
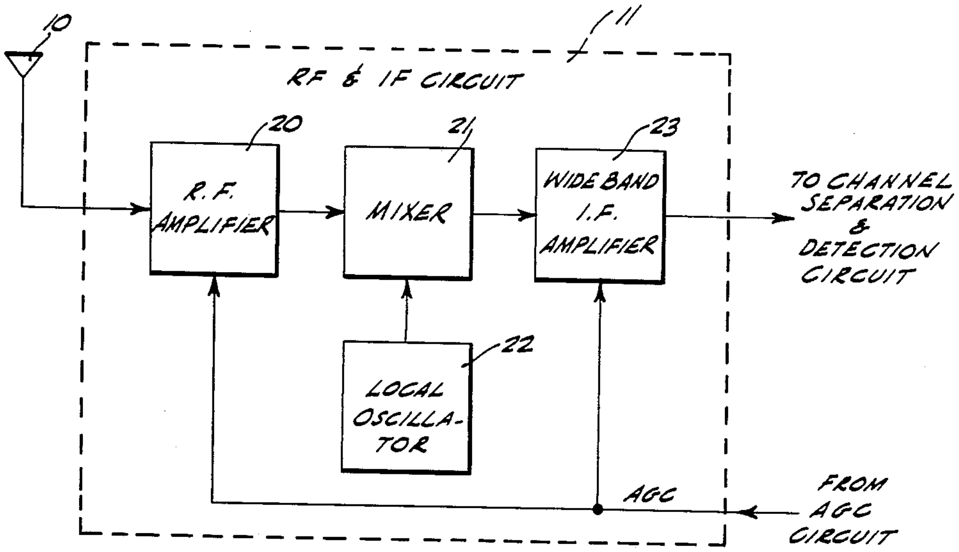
FIG. 2 is a block diagram of the RF and IF (radio frequency and intermediate frequency) circuit of the radio receiver of FIG. 1.

Referring to FIG. 2, the RF and IF circuit 11 includes an RF (radio frequency) amplifier 20 to which the antenna 10 is connected. The RF amplifier 20 is a conventional circuit and may be of the type shown on page 922 of the book "Radiotron Designers' Handbook," Fourth Edition, reproduced and distributed by Radio Corporation of America. In the present example, the RF amplifier 20 is designed to select and amplify signals having a bandwidth of approximately eight kilocycles occurring in the high frequency radio spectrum of approximately 3–30 megacycles per second. The output of the RF amplifier 20 is connected to the signal input of a mixer 21, or frequency converter, which may have the configuration indicated on page 394 of the book "Television Engineering" by Donald G. Fink, Second Edition, published by the McGraw-Hill Book Company, Inc.

A local oscillator 22, which may have the configuration shown on page 397 of the book "Television Engineering," referenced above, is connected to the injection input of the mixer 21. In well known fashion, the frequency of the received signal is converted to an intermediate frequency at the output of the mixer 21 and is applied to the input of a wideband IF (intermediate frequency) amplifier 23. The intermediate frequency may be on the order of 1000 kilocycles per second, for example. This circuit may have the configuration shown on page 356 of the book "Television Engineering" and has a bandwidth of approximately 8 kilocycles per second. An AGC voltage is applied to the RF amplifier 20 and the wideband IF amplifier 23 and may, if desired, be applied to the mixer 21 also. This may be easily accomplished as indicated on page 405 of the book "Television Engineering." The received multi-channel signal is thus amplified at a convenient frequency and appears at the output of the RF and IF circuit 11.

Figure 3:
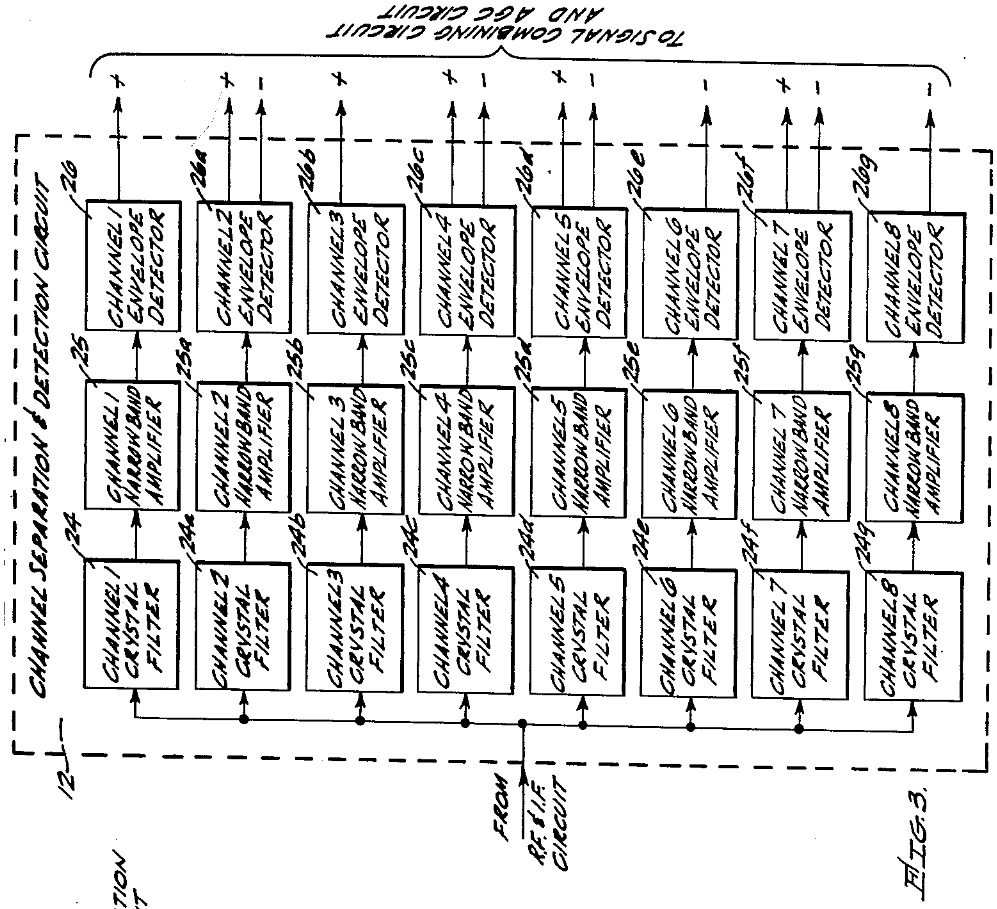
FIG. 3 is a block diagram of the channel separation and detection circuit of the radio receiver of FIG. 1.

The wideband IF signal is applied to the channel separation and detection circuit 12, illustrated in FIG. 3, where the subcarrier signal components are separated and demodulated. The broadband signal is applied in parallel to eight crystal filters **24–24*g*, each tuned to the frequency of a different one of the subcarrier channels. The crystal filters 24–24*g* may be of the type shown on page 656 of "Radio Engineers' Handbook" by F. E. Terman, First Edition, McGraw-Hill Book Co., Inc. The output of each of the eight crystal filters 24–24*g* is individually applied to the input of a different one of eight narrowband amplifiers 25–25*g*, respectively, where the subcarrier signal components are individually amplified and further separated from adjacent subcarrier signal components. The narrowband amplifiers 25–25*g* may be tuned amplifiers such as those shown on page 435 of Terman's "Radio Engineers' Handbook." The bandwidth of the crystal filters 24–24*g* and the narrowband amplifiers may be on the order of 900 cycles per second, for example. The output of each of the narrowband amplifiers 25–25*g* is individually connected to a different one of eight envelope detectors 26–26*g*. These envelope detectors 26–26*g*** are pairs of diode demodulators of the type shown on page 554 of Terman's "Radio Engineers' Handbook," arranged to produce both positive-going and negative-going output pulses.

If desired, each of the subcarrier channels may have its own individual AGC circuit, that is, for example, the channel 1 envelope detector 26 may provide a negative AGC voltage which is applied to the channel 1 narrowband amplifier 25. Note that each of the channels in the channel separation detection circuit 12 may be identical except for the subcarrier frequency, that is, the channel 1 crystal filter 24, narrowband amplifier 25 and envelope detector 26 may be identical to the channel 2 crystal filter **24*a*, narrowband amplifier 25*a* and envelope detector 26*a*. However, it will be noted that the channels 1 and 3 envelope detectors 26 and 26*b* each provide a single output and that this output is positive only, whereas the channels 2, 4, 5 and 7 envelope detectors 26*a*, 26*c*, 26*d* and 26*f* each provide two outputs, one being positive and the other being negative. The channels 6 and 8 envelope detectors 26*e* and 26*g* each provide a single output that is negative. The required polarity of the output pulses from the eight envelope detectors 26–26*g* depends upon the particular pattern of the signal being received. For other patterns than the exemplary signal pattern described hereinafter, other combinations of polarities may be required at the output of the channel separation and detection circuit 12. However, each of the envelope detectors 26–26*g*** may provide two outputs one being positive and the other being negative, thus permitting a selection to be made according to the signal pattern to be received.

Figures 4, 6:
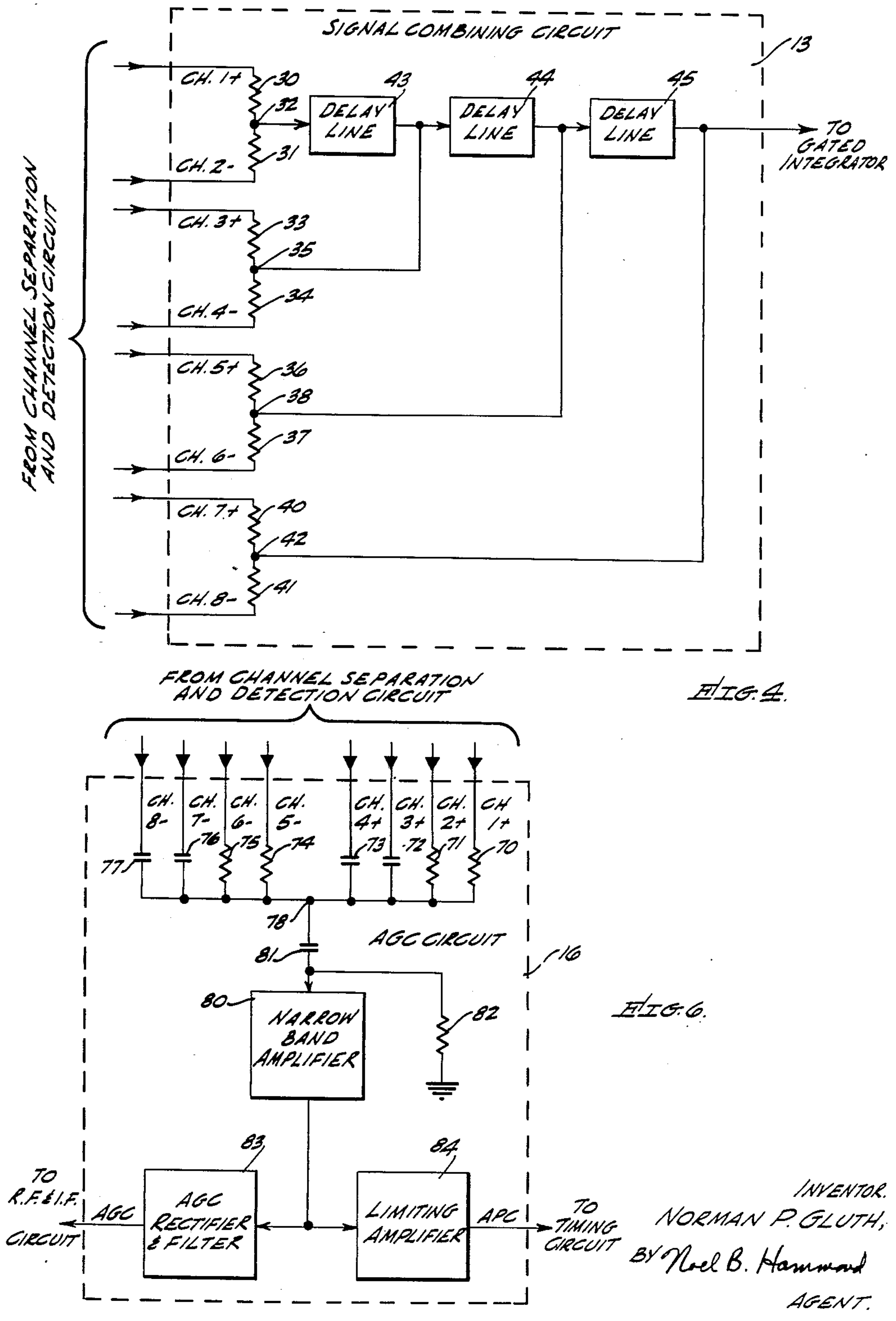
FIG. 4 is a block diagram of the signal combining circuit of the radio receiver of FIG. 1.
FIG. 6 is a diagram partly in block form and partly in schematic form of an embodiment of an AGC (automatic gain control) circuit in accordance with the invention which is employed in the radio receiver of FIG. 1.

Referring now to FIG. 4, the output pulses from the channel separation and detection circuit 12 are combined in the signal combining circuit 13. The positive output of the channel 1 envelope detector 26 is applied to one end of a first summing resistor 30 and the negative output of the channel 2 envelope detector **26*a* is applied to one end of a second summing resistor 31. The remaining ends of the first and second summing resistors 30 and 31 are connected together at a junction 32. Similarly, the positive output of the channel 3 envelope detector 26*b* is connected to one end of third summing resistor 33 and the negative output of the channel 4 envelope detector 26*c* is connected to one end of a fourth summing resistor 34, the third and fourth summing resistors 33 and 34 having their remaining ends connected together at a second junction 35. In a like manner the positive and negative outputs of the next pair of detectors, the channels 5 and 6 envelope detectors 26*d* and 26*e*, are combined in another pair of summing resistors 36 and 37 to produce a combined output at another junction 38. Finally, the positive and negative outputs of the channels 7 and 8 envelope detectors 26*f* and 26*g* are combined in a final pair of summing resistors 40 and 41 to produce a combined output at a last junction 42. The connection of the remaining outputs of the channel separation and detection circuit 12** will be described hereinafter.

The junction 32 of the first and second summing resistors 30 and 31 is connected to the input of a first delay line 43, the output of which is connected to the input of a second delay line 44. The junction 35 of the third and fourth summing resistors 33 and 34 is also connected to the input of the second delay line 44. The output of the second delay line 44 is connected to the input of a third delay line 45. The junction 38 of the fifth and sixth summing resistors 36 and 37 is also connected to the input of the third delay line 45. The junction 42 of the seventh and eighth summing resistors 40 and 41 is connected to the output of the third delay line 45 which forms the output of the signal combining circuit 13. All three of the delay lines 43, 44 and 45 provide identical amounts of time delay which, in the present example, is 1 millisecond.

Figure 5:
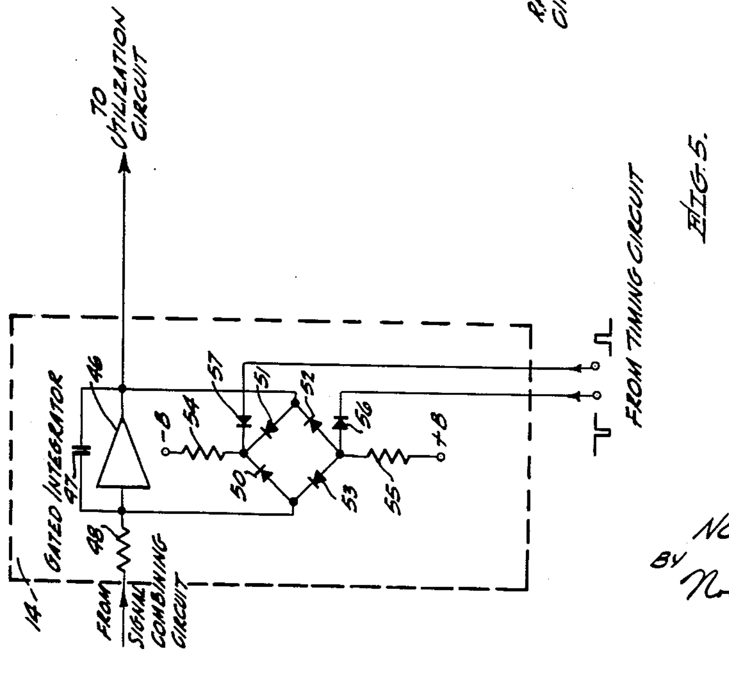
FIG. 5 is a schematic diagram of the gated integrator of the radio receiver of FIG. 1.

The combined pulses at the output of the third delay line 45 of the signal combining circuit 13 are applied to the input of the gated integrator 14 (FIG. 5). The gated integrator 14 utilizes a so-called Miller integrator which is an inverting D.C. amplifier 46 having a capacitor 47 connected from the output to the input thereof and a resistor 48 connected in series between the output of the signal combining circuit 13 and the input of the amplifier 46. Gating of the integrator 14 is accomplished by means of a diode bridge. A first diode 50 has its anode connected to the input of the amplifier 46 and a second diode 51 has its cathode connected to the cathode of the first diode 50. A third diode 52 has its cathode connected to the anode of the second diode 51, the junction of the two diodes 51 and 52 being connected to the output of the amplifier 46. The anode of a fourth diode 53 is connected to the anode of the third diode 52 and the cathode of the fourth diode is connected to the anode of the first diode 50 which is also connected to the input of the amplifier 46.

At the junction of the first and second diodes 50 and and 51, a negative bias voltage, indicated as —B in FIG. 5, is applied through a resistor 54. Similarly, at the junction of the third and fourth diodes 52 and 53, a positive bias voltage, indicated as +B, is applied through another resistor 55. The bias voltages bias the diodes 50–53 to be normally conductive. Negative gating pulses are periodically applied to the cathode of a fifth diode 56 whose anode is connected to the junction of the third and fourth diodes 52 and 53, and positive gating pulses, time coincident with the aforementioned negative gating pulses, are periodically applied to the anode of a sixth diode 57 whose cathode is connected to the junction of the first and second diodes 50 and 51. The positive and negative gating pulses exceed the bias voltages —B and +B and cause the diodes 50–53 to become nonconductive. The output of the gated integrator 14 is connected to a utilization circuit 15, such as a teletypewriter, for display.

The information processing circuits for the radio receiver have been described to illustrate the connection and utility of an embodiment of the AGC (automatic gain control) circuit 16 of the present invention which will now be described.

Referring to FIG. 6 wherein there is shown an exemplary embodiment of an AGC circuit 16 in accordance with the invention, the demodulated pulses from the channel separation and detection circuit 12 are combined in a phase shifting and summing matrix such that all pulses add vectorially to produce a sinusoidal component. The positive output of the channel 1 envelope detector 26 is connected to one end of a resistor 70 and the positive output of the channel 2 envelope detector **26*a* is connected to one end of another resistor 71. The positive outputs of the channels 3 and 4 envelope detectors 26*b* and 26*c* are individually connected to one end of different capacitors 72 and 73. The negative outputs of the channels 5 and 6 envelope detectors 26*d* and 26*e* are each individually connected to one end of different resistors 74 and 75; and the negative outputs of the channels 7 and 8 envelope detectors 26*f* and 26*g* are each individually connected to one end of different capacitors 76 and 77. The remaining ends of these eight impedance elements 70–77 are all joined together at a junction 78. The resistors 70, 71, 74 and 75 are all of equal value and may be on the order of 430,000 ohms and the capacitors 72, 73, 76 and 77 are also of equal value and may be on the order of 1500 micromicrofarads. These values are determined by making the capacitive reactance of the capacitors 72, 73, 76 and 77 equal to the resistance of the resistors 70, 71, 74 and 75** at the signaling rate which, in the present example, is 250 cycles per second.

The junction 78 is connected to the input of a narrowband amplifier 80 through a capacitor 81 connected in series therebetween. A resistor 82 is connected from the input of the amplifier 80 to a point of reference potential indicated as ground. It will be understood that the signals appearing in the various circuits of the receiver are measured and applied with respect to ground. The capacitive reactance of this capacitor 81 is also made approximately equal to the resistance of this resistor 82 at the signaling rate. The narrowband amplifier 80 is tuned to the signaling rate which, as was previously mentioned, is 250 cycles per second in the present example, and may have a bandwidth of only 8 or 9 cycles per second, for example. The narrowband amplifier 80 may be an amplifier having an inductance-capacitance resonant circuit as shown on page 435 of Terman's "Radio Engineers' Handbook."

The output of the narrowband amplifier 80 is connected to the inputs of both an AGC rectifier and filter 83 and a limiting amplifier 84. The AGC rectifier and filter 83 may be a diode followed by a resistance-capacitance filter as shown on page 641 of Terman's "Radio Engineers' Handbook" and the limiting amplifier 84 may be the circuit shown on page 351 of the book "Time Bases" by O. S. Puckle, Second Edition, published by John Wiley and Sons, Inc. which changes a sine wave into a square wave. The output of the AGC rectifier and filter 83 is connected back to the RF and IF circuit 11 for control of the gain thereof and may also be connected to the narrowband amplifiers **25–25*g* of the channel separation and detection circuit 12, if desired. The output of the limiting amplifier 84 is connected to the timing circuit 17** to synchronize the gating pulses with the received pulse signal.

Figure 7:
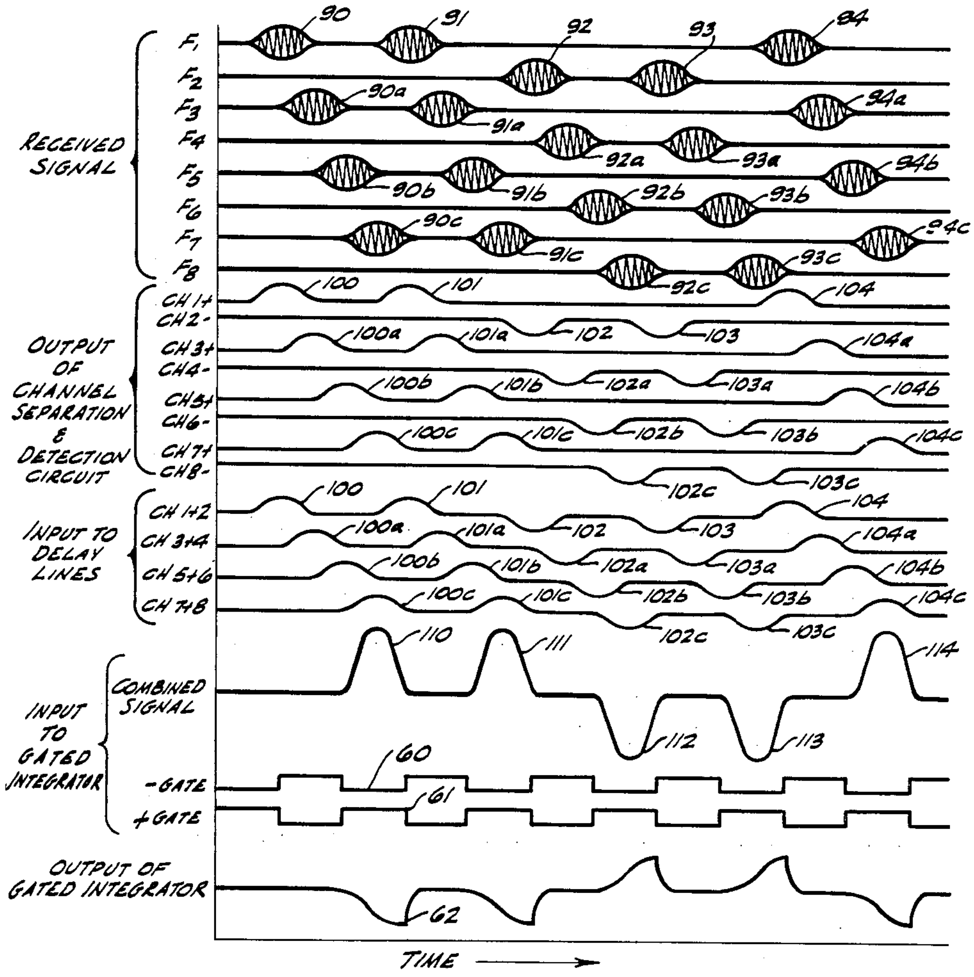
FIG. 7 is a diagram of waveforms illustrating the operation of the radio receiver of FIG. 1.

In operation, the receiver of FIG. 1 receives a multichannel redundant pulse signal indicated by the waveforms at the top of FIG. 7. The received signal is composed of radio frequency pulses at eight subcarrier frequencies indicated in FIG. 7 as $f_1$–$f_8$. The signal occupies a frequency bandwidth of approximately 8 kilocycles per second and is in the high frequency radio spectrum of approximately 3–30 megacycles per second in the exemplary embodiment described. Each subcarrier frequency is separated by 900 cycles per second from the next adjacent subcarrier frequency. The pulses are four times redundant, that is, for each digital information bit, four pulses are transmitted. Thus, the twenty received signal pulses shown in FIG. 7 represent five bits of information.

Dual symbol operation rather than single symbol operation is employed in the radio receiver of the present example. In single symbol operation, a pulse is transmitted for a radio-telegraph "mark" symbol but no pulse is transmitted for a "space" symbol. In dual symbol operation, a pulse is transmitted at one frequency to indicate a "mark" symbol and a pulse is transmitted at a different frequency to indicate a "space" symbol. A binary "1" or radiotelegraph "mark" symbol is indicated by sequential or time-staggered pulses occurring first in channel 1, then in channel 3, channel 5 and channel 7, whereas a binary "zero" or radiotelegraph "space" symbol is represented by a pulse appearing first in channel 2, then in channel 4, channel 6 and channel 8. Thus, the information represented in FIG. 7 is "mark," "mark," "space," "space," "mark."

The signal may also be considered to be four frequency-shift radiotelegraph channels utilized sequentially to provide redundancy. That is, a first train of signal pulses occurs at either the first frequency $f_1$ or the second frequency $f_2$ according to whether the information transmitted is "marks" or "spaces." A second train of signal pulses occur at either the third or four frequencies $f_3$ or $f_4$. The second train of signal pulses are identical to the first, except that they are initiated at a slightly later time. Similarly, third and fourth identical trains of signal pulse trains occur at 3rd and 4th pairs of frequencies $f_5$, $f_6$ and $f_7$, $f_8$, respectively, and further delayed in time.

Each received signal pulse is two milliseconds in duration and the pulses occur sequentially and with a one millisecond overlap. That is, a pulse is initiated at one subcarrier frequency before the previous pulse has terminated at another subcarrier frequency. The pulses are shaped to provide a substantially constant peak power output at the transmitter. The pulses may have, for example, a cosine-squared shape. The advantage of this type of transmission of information is that the transmitter is effectively on continuously at 100% modulation. Although each received signal pulse is actually 2 milliseconds in duration, most of the pulse energy is concentrated in a one millisecond interval in the middle of the pulse, due to the pulse shaping. Thus, the signal pulses may be considered to be equivalent to non-overlapping, sequential pulses of 1 millisecond duration.

Although the separation between successive pulses at any one subcarrier frequency is actually 2 milliseconds, the separation is effectively 3 milliseconds between the pulses of effectively 1 millisecond duration. This separation or "dead space" between pulses at each subcarrier frequency is to permit all of the significant multipath signal components of one pulse to be received before the next successive pulse is received. Although the signal pulses occur at the rate of 1000 pulses per second, the basic keying or signaling rate is 250 pulses per second due to the factor of four redundancy. This type of operation, which may be termed quantized frequency modulation or frequency sidestepping, provides a high probability that the information will be received in spite of interference, selective fading or other deleterious conditions.

As stated previously, the received pulse signal in the present example represents first a "mark" indicated by pulses 90–90*c* in FIG. 7, another "mark" indicated by pulses 91–91*c*, a "space" indicated by pulses 92–92*c*, another "space" indicated by pulses 93–93*c*, and a final "mark" indicated by pulses 94–94*c*. The received signal is selected, changed to an intermediate frequency, and amplified by the RF and IF circuit 11. The amplified IF signal is applied to the channel separation and detection circuit 12 which separates the subcarrier pulse signals according to their subcarrier frequencies by means of the crystal filters 24–24*g* and narrowband amplifiers 25–25*g*. The envelope detectors 26–26*g* provide positive and negative output pulses proportional to the received signal pulses 90–94*c*.

Thus, positive pulses 100, 101 and 104 are developed at the output of the channel 1 envelope detector 26 in response to the received signal pulses 90, 91 and 94, respectively, at the frequency of the first subcarrier $f_1$. The first "mark" symbol, represented by the received signal pulses 90–90*c* results in the pulses 100–100*c* appearing at the outputs of the channel 1, 3, 5 and 7, envelope detectors 26, 26*b*, 26*d* and 26*f*. "Space" symbol pulse signals are represented by negative pulses appearing at the outputs of the channel 2, 4, 6 and 8 envelope detectors 26*a*, 26*c*, 26*e* and 26*g*. For example, the first "space" symbol represented by the received pulses 92–92*c* results in the negative pulses 102–102*c*. The output of the channel separation and detection circuit 12 may be considered to be four trains of pulses appearing at four pairs of channels, a pulse of any train appearing at one or the other of the channels of its associated pair of channels according to whether a "mark" or "space" symbol has been received.

The pulses from the channel separation and detection circuit 12 are combined in the signal combining circuit 13 by channel pairs. For example, the channel 1 output, which is positive, is combined with the channel 2 negative output in the summing resistors 30 and 31 to produce at the junction 32, pulses 100–104, which are positive or negative, depending upon whether a "mark" or "space" was transmitted. Similarly, positive and negative pulses from channels 3 and 4 are combined to produce combined pulses at junction 35; channels 5 and 6 produce combined pulses at junction 38, and channels 7 and 8 produce combined pulses at junction 42. It will be noted that the combined pulses at the four junctions 32, 35, 38 and 42 are identical but differ in time of initiation with respect to each other. That is, the channel 1 and 2 pulse train at junction 32, comprised of pulses 100–104, is identical in polarity and spacing to the channel 3 and 4 pulse train at junction 35, comprised of pulses 100*a*–104*a*.

The delay lines 43, 44 and 45 delay the first three trains of combined pulses to be coincident with the last train of combined pulses. That is, the combined pulses from channels 1 and 2 at junction 32 are delayed by all three delay lines 43, 44 and 45, which produce a 3 millisecond delay causing the delayed pulses from channels 1 and 2 to be coincident in time with the pulses from channels 7 and 8. Similarly, the combined pulses of channels 3 and 4 appearing at junction 35 are delayed through two of the delay lines 44 and 45 to be coincident with the combined pulses from channels 7 and 8 appearing at junction 42. The pulses from channels 5 and 6 appearing at junction 38 are delayed by one millisecond in the third delay line 45 so that they also will be coincident with the pulses from channels 7 and 8. Thus, pulses 100–100*c* are combined into a single pulse 110, the pulses 101–101*c* are combined into the single pulse 111, pulses 102–102*c* are combined into pulse 112, pulses 103–103*c* are combined into pulse 113, and the four pulses 104–104*c* are combined into pulse 114. The positive pulses 110, 111 and 114 represent "mark" symbols and the negative pulses 112 and 113 represent "space" symbols.

The combined pulses at the output of the signal combining circuit 13, comprising pulses 110–114, are shown in FIG. 7 as they appear under optimum circumstances. Under other conditions, noise and interference may be present at the output of the signal combining circuit 13 along with the signal pulses 110–114. In addition, the pulses which combine to produce the signal pulses 110–114 may not be exactly coincident after they are combined, due to differences in the propagation delay time between the transmitter and the receiver at different subcarrier frequencies. Accordingly, a very irregular waveform may appear at the output of the signal combining circuit 13 making it difficult to determine whether "mark" or "space" symbols have been received. Consequently, this combined output signal is applied to the gated integrator 14 where the energy present during each pulse interval is integrated and output pulses are produced indicative of whether "mark" or "space" symbols were received.

The Miller integrator circuit, comprising the amplifier 46, capacitor 47 and the resistor 48 in FIG. 5, integrates the first pulse 110 during the time interval that negative and positive gating pulses 60 and 61 are applied to the diodes 50–53 from the timing circuit 17. The gating pulses 60 and 61 bias the diodes 50–53 to be nonconductive, thereby presenting a high impedance to the input and output of the amplifier 46. Thus, the gated integrator 14 is able to integrate the energy at its input as long as the high impedance state of the diodes 50–53 persists. At the end of the integration interval, the negative and positive gating pulses 60 and 61 terminate and the integrator capacitor 47 is discharged through the diodes 50–53 which are now biased to be conductive by the bias voltages +B and −B. When the diodes 50–53 are conductive, a low impedance is presented to the input and output of the amplifier 46, discharging the capacitor 47, preventing any charge from accumulating on the capacitor 47 and preventing any energy applied to the input of the amplifier 46 from reaching the output. Thus, even though there may be noise energy, interfering signals or misalignment of the pulses that produce the combined pulse 110, all of the energy appearing during the integrating interval is integrated to derive an output pulse 62. The output pulse 62 is inverted in polarity by the amplifier 46. Any interference or noise appearing between gating intervals is blanked out due to the gating action of the diodes 50–53.

Thus, the digital information transmitted to the receiver is recovered and applied to the utilization circuit 15 where it is displayed. The integrated pulses may be directly utilized or they may be sampled immediately prior to the end of the integration period and applied to a threshold circuit or to a flip-flop to provide a train of square-wave pulses. Now that it is apparent how the digital information is recovered from the received redundant multi-channel signal pulses, the operation of the AGC (automatic gain control) circuit 16 will be described.

Figure 8:
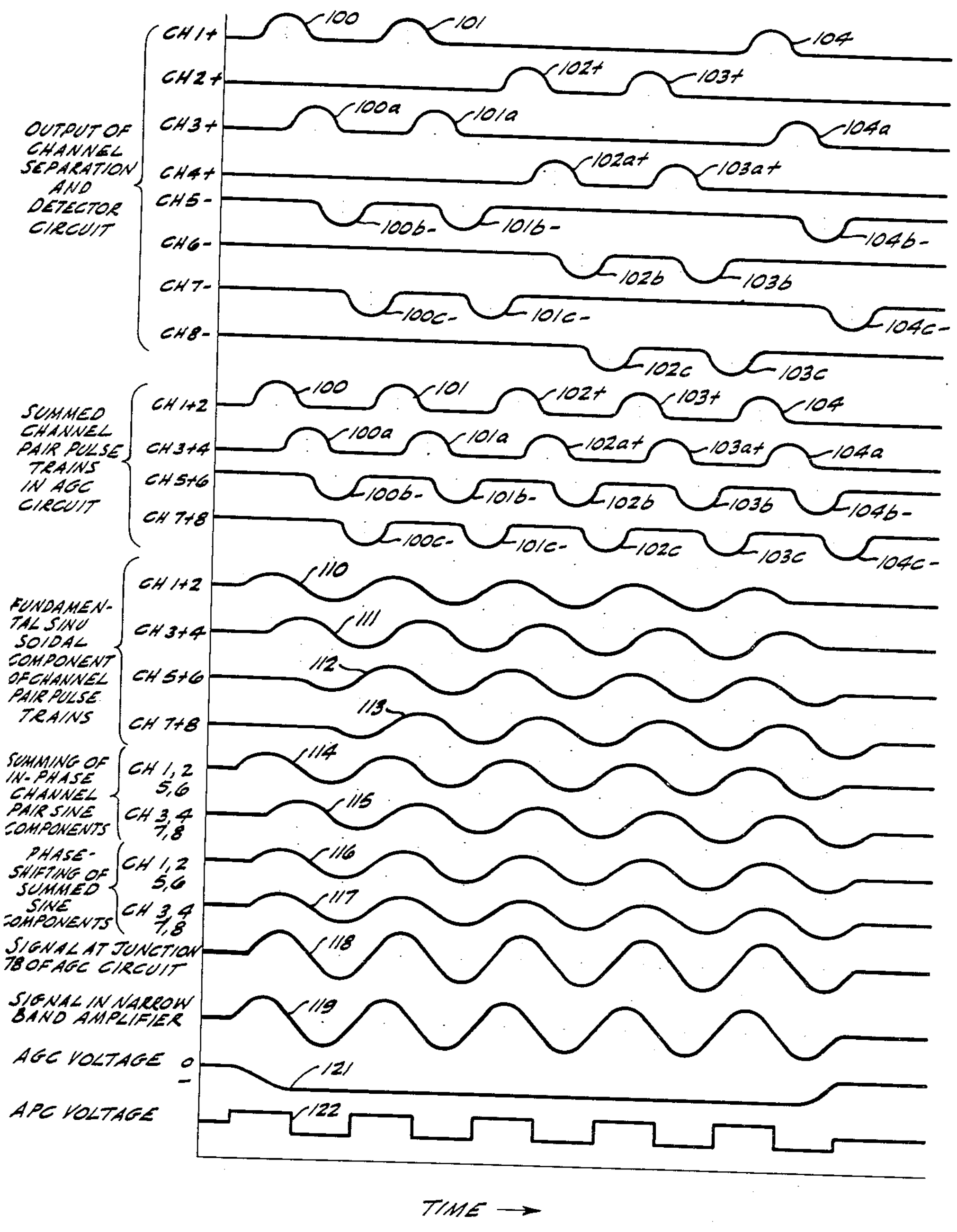
FIG. 8 is a diagram of waveforms illsutrating the operation of the AGC (automatic gain control) circuit of FIG. 6.

Referring now to the waveform diagram of FIG. 8 in conjunction with the circuit diagram of FIG. 6, the output pulses from the channel separation and detection circuit 12 are applied to the AGC circuit 16. The output pulses from the channel separation and detection circuit 12 shown in FIG. 8 are identical with those shown in FIG. 7, excepting that in the case of channels 2 and 4, the positive output pulses are applied to the AGC circuit 16 instead of the negative output pulses, and in the case of channels 5 and 7, the negative output pulses are utilized in place of the positive output pulses. The designation of the channels 2 and 4 pulses in FIG. 8 with a plus sign, as 102+ for example, indicates that these pulses are identical with the corresponding channels 2 and 4 pulses of FIG. 7, as pulse 102, except that the polarity is reversed. Similarly, the channels 5 and 7 pulses of FIG. 8 have been designated with a minus sign.

The output pulses from the channel separation and detection circuit 12 are combined in the phase shifting and summing matrix of the AGC circuit 16, shown in FIG. 6 and comprising the impedance elements 70 through 77. The eight pulse trains from the channel separation and detection circuit 12 are summed, or linearly combined in pairs. The output of the channel separation and detection circuit 12 may also be considered to be only four pulse trains applied to four pairs of terminals, the pulses of each train being applied to either one or the other of the terminals of its associated pair of terminals, depending upon whether a "mark" or "space" symbol has been received.

The pulses 100, 101 and 104 from the channel 1 envelope detector 26 are summed with the pulses 102+ and 103+ from the channel 2 envelope detector **26*a* in the first two resistors 70 and 71 of the AGC circuit 16**. As indicated in FIG. 8, a train of periodic positive pulses is the result of the summing action. The repetition rate of the summed channel pair pulse train is equal to the information signaling rate which, in the present example, is 250 pulses per second.

In a similar manner, the pulses **100*a*, 101*a* and 104*a* from the channel 3 envelope detector 26*b* are summed with the pulses 102*a*+ and 103*a*+ from the channel 4 envelope detector 26*c* in the first two capacitors 72 and 73 of the AGC circuit 16. In considering the summing action, the capacitors 72 and 73 are considered to be merely impedance elements that produce the same result as if the summing took place in a pair of resistors. Accordingly, a second train of periodic positive pulses is produced. This second pulse train is identical in repetition rate with the first pulse train, but the one millisecond time delay introduced at the transmitter causes the second pulse train to lag the first by one millisecond. Similarly, the channels 5 and 6 negative pulses 100*b*−, 101*b*−, 102*b*, 103*b* and 104*b*− are summed in their associated resistors 74 and 75 and the channels 7 and 8 negative pulses 100*c*−, 101*c*−, 102*c*, 103*c* and 104*c* are summed in their associated capacitors 76 and 77** to produce two trains of negative periodic pulses successively lagging the first two trains of pulses.

Due to the periodic nature of the four pulse trains, various periodic wave components are present. Among these is a 250 cycles per second fundamental sinusoidal wave component. The summed channels 1 and 2 train of pulses 100, 101, 102+, 103+ and 104 has a fundamental sine wave component 110, illustrated in FIG. 8. Similarly, the summed channels 3 and 4 train of pulses **100*a*, 101*a*, 102*a*+, 103*a*+ and 104*a* has a fundamental sine wave component 111. The positive-going half-cycles of these sine waves 110 and 111 are coincident with the occurrence of the pulses of their associated pulse trains and, due to the one millisecond time lag between the two pulse trains there is a 90° phase difference between the two sine waves 110 and 111. The channels 5 and 6 pulse train also has a fundamental sine wave component 112 and, in like manner, the channels 7 and 8 pulse train has a fundamental sine wave component 113. However, the negative-going half-cycles of the latter two sine waves 112 and 113 are coincident with the occurrence of the pulses of their associated pulse trains due to the fact that the channels 5 and 6 and channels 7 and 8 pulses are negative. The channels 5 and 6 and channels 7 and 8 sine wave components 112 and 113** also have successive 90° phase differences.

There is thus a 180° phase difference between the channels 1 and 2 sine wave component 110 and the channels 5 and 6 sine wave component 112. Similarly, there is a 180° phase difference between the channels 3 and 4 sine wave component 111 and the channels 7 and 8 sine wave component 113. However, due to the channels 1–4 pulses being positive and the channels 5–8 pulses being negative, the channels 5 and 6 and channels 7 and 8 sine wave components 112 and 113 have an apparent 180° phase reversal with respect to the remaining two sine wave components 110 and 111. Hence, the positive going half-cycles of the channels 1 and 2 sine wave 110 are actually coincident or in phase with the positive-going half-cycles of the channels 5 and 6 sine wave 112. Similarly, the channels 3 and 4 sine wave 111 is actually in phase with the channels 7 and 8 sine wave 113.

Clearly, the channels 1, 2, 5 and 6 pulse trains can be said to have a combined fundamental sine wave component 114 and the channels 3, 4, 7 and 8 pulse trains can be said to have a combined fundamental sine wave component 115, 90° displaced from the former wave 114. The first combined wave 114 can be considered as being applied from an equivalent generator to a series network comprising an equivalent resistor and capacitor having values equal to one-fourth of the resistance of the resistors 70, 71, 74 and 75 and one-fourth of the capacitive reactance of the capacitors 72, 73, 76 and 77 of the phase shifting and summing network of the AGC circuit 16. The output between the junction 78 and ground for the first combined wave 114 is across the equivalent capacitance of the network. Because the resistance of the network equals the capacitive reactance of the network, a current flows in the network that leads the applied wave 114 by 450°. The voltage across the capacitance lags the current by 90° resulting in an output wave 116 between junction 78 and ground that lags the applied wave 114 by 45°.

The second combined wave 115 can also be considered as being applied from an equivalent generator to the same equivalent R–C network. However, the output between the junction 78 and ground for the second wave 115 is across the equivalent resistance of the network. Again, the current in the network leads the applied wave 115 by 45° and the voltage across the equivalent resistance of the network is in phase with the current through it. Accordingly, an output wave 117 appears between junction 78 and ground that leads the applied wave 115 by 45°. Inasmuch as the second applied wave 115 lags the first applied wave 114 by 90°, the two output waves 116 and 117 are in phase, due to each being shifted 45° toward the other. Accordingly, the two output waves 116 and 117 combine into a single wave 118 at the junction 78.

Thus, all of the pulses from the channel separation and detection circuit 12 combine in the phase shifting and summing matrix of the AGC circuit 16 to produce a signal having a single, fundamental sinusoidal wave component 118. This sine wave component 118 has a frequency equal to the information signaling rate, 250 cycles per second in the present example, and has an amplitude proportional to the amplitude of the received pulse signals. It should be apparent that noise, interfering signals or pulse signals with other patterns will not combine to produce a sine wave component 118.

The sine wave component 118 at the junction 78 is shifted 45° in phase by the capacitor 81 and resistor 82, as indicated by waveform 119 of FIG. 8, and applied to the narrowband amplifier 80. The narrowband amplifier 80 passes only the 250 cycles per second sinusoidal wave component 119, amplifies it and reproduces it at the output thereof, as indicated in FIG. 8. This sinusoidal wave component 119 is then applied to the AGC rectifier and filter 83 where it is converted to a slowly varying negative AGC voltage 121 having an amplitude that is a function only of the amplitude of the multi-channel signal of interest. Noise, interferring signals or other multi-channel signals having different characteristics will not produce a sine wave of appreciable amplitude at the output of the narrowband amplifier 80 and will not produce an appreciable AGC voltage.

The sinusoidal signal from the narrowband amplifier 80 is also applied to the input of the limiting amplifier 84 which amplifies and clips the sine wave to produce a square wave 122 which is used as an APC (automatic phase control) voltage for synchronization of the gating pulses produced by the timing circuit 17. Thus, when the predetermined signal is received, AGC and APC voltages are produced regardless of whether "mark" or "space" symbols are transmitted provided that the information signaling rate is 250 pulses per second. The predetermined signal is therefore uniquely effective in determining the gain of the various stages of the receiver and in determining the timing of the gating and sampling pulses.

It is to be understood that although the automatic gain control circuit of the present invention has been illustrated with referenc to one specific signal having unique characteristics, this type of circuit arrangement may be modified to tbe responsive to other signals having a different keying pattern, keying rate or number of channels. Furthermore, this type of AGC circuit is able to recognize when a signal, for which the receiver is designed, is being received and can provide an indication thereof or automatically turn on the utilization circuit. Additionally, a receiver which is adapted to receive several different types of signals can be arranged to distinguish one signal from another by means of several AGC circuits of the type described herein, each circuit being adjusted to produce a sine wave when only one of the several patterns of signals is received. It will be evident that delay lines could be used instead of the phase shifting and summing matrix to combine the received pulses into coincidence. However, the disclosed matrix is much simpler although more lossy, than delay lines.

Thus, there has been described a selective automatic gain control and automatic phase control circuits for combining a unique series of signal pulses initiated at successive times to produce automatic gain control and automatic phase control voltages.

What is claimed is:

1. A circuit for developing an automatic gain control voltage and an automatic phase control voltage in response to a plurality of trains of repetitive pulses having the same repetition rate and being individually applied to different pairs of terminals, the pulses of each of said trains being applied to either one or the other of the terminals of the pair of terminals associated therewith, the pulses of each of said trains of pulses being initiated at different times and the time intervals between initiation of successive pulses having a predetermined value, half of said trains having pulses occurring at succeeding times being of one polarity and the pulses of the remaining trains being of the other polarity, said circuit being nonresponsive to noise and other pulse patterns; said circuit comprising: summing and phase-shifting means coupled to said terminals for combining said trains of pulses into a composite signal including a fundamental periodic wave component having a period proportional to the repetition rate of said pulses; resonant means tuned to the period proportional to the repetition rate of said pulses and coupled to said means; rectifying and filtering means coupled to the output of said resonant means for developing an automatic gain control voltage; and a limiting amplifier connected to the output of said resonant means for developing an automatic phase control voltage.

2. A circuit for developing an automatic gain control voltage and an automatic phase control voltage in response to an even plurality of trains of repetitive pulses having the same repetition rate and being individually applied to different pairs of terminals, the pulses of each of said trains being applied to either one or the other of the terminals of the pair of terminals associated therewith, the pulses of each of said trains of pulses being initiated at different times and the time interval between initiation of successive pulses having a predetermined value, half of said trains having pulses occurring at succeeding times being of one polarity and the pulses of the remaining trains being of the other polarity, said circuit being nonresponsive to noise and other pulse patterns; said circuit comprising: a phase shifting and summing matrix including a plurality of capacitors, each having one end individually connected to a different one of the terminals of the pairs of terminals associated with said trains of pulses occurring at times separated by one of said intervals, a plurality of resistors each having one end individually connected to a different one of the remaining terminals; resonant means tuned to the period corresponding to the repetition rate of said pulses and coupled to the free ends of said resistors and capacitors; rectifying and filtering means coupled to the output of said resonant means for developing an automatic gain control voltage; and a limiting amplifier connected to the output of said resonant means for developing an automatic phase control voltage.

3. An automatic gain control circuit responsive to a predetermined signal and nonresponsive to noise and other signals; said circuit comprising: a controlled-gain amplifier for amplifying a plurality of trains of applied repetitive pulse signals having the same repetition rate and being initiated at different times, the time interval between initiation of successive pulse signals having a predetermined value; detector means having an input coupled to the ouput of said amplifier and responsive to said pulse signals for developing a plurality of trains of pulses corresponding to said trains of pulse signals in time of occurrence and amplitude and having predetermined polarities; phase-shifting means coupled to said detector means for combining said pulses to develop a composite signal including a fundamental periodic wave component having an amplitude and period proportional to the amplitude and repetition rate of said pulse signals; resonant means tuned to a predetermined frequency and having an input coupled to the output of said phase shifting-means for developing a periodic wave in response to said fundamental wave component of said composite signal having a period corresponding to the frequency of said resonant means; and means having an input coupled to the output of said resonant means and being responsive to said periodic wave for developing an automatic gain control voltage, said automatic gain control voltage being applied to said amplifier to control the gain thereof.

4. An automatic gain control and automatic phase control circuit responsive to a plurality of trains of repetitive pulse signals having the same repetition rate and occurring at different pairs of signal frequencies, the pulse signals of each of said trains occurring at either one or the other of the frequencies of the pair of signal frequencies associated therewith, the pulse signals of each of said trains being initiated at different times and the time interval between initiation of successive pulse signals having a predetermined value; said circuit comprising a controlled-gain amplifier responsive to said trains of pulse signals for amplification thereof; a signal separation and detection circuit having an input coupled to the output of said amplifier and being responsive to said pulse signals for developing a plurality of trains of pulses corresponding to said trains of pulse signals in time of occurrence and amplitude and being individually applied to different pairs of terminals corresponding to said pairs of signal frequencies, half of said trains having pulses occurring at succeeding times being of one polarity and the pulses of the remaining trains being of the other polarity; summing and phase-shifting means coupled to said terminals for combining said trains of pulses into a composite signal including a fundamental periodic wave component having a period proportional to the repetition rate of said pulse signals; resonant means tuned to the period proportional to the repetition rate of said pulse signals and coupled to said means; rectifying and filtering means coupled to the output of said resonant means for developing an automatic gain control voltage, said automatic gain control voltage being applied to said amplifier to control the gain thereof; a source of gating pulses having a repetition rate related to the repetition rate of said pulse signals; and a limiting amplifier connected to the output of said resonant means for developing an automatic phase control voltage, said automatic phase control voltage being applied to said source of gating pulses for synchronization thereof.

References Cited in the file of this patent

UNITED STATES PATENTS

| | | |
|---|---|---|
| 2,246,688 | Kircher | June 24, 1941 |
| 2,454,415 | Tourshou | Nov. 23, 1948 |
| 2,605,340 | Disney | July 29, 1952 |
| 2,778,933 | Chist | Jan. 22, 1957 |
| 2,863,046 | Eliason | Dec. 2, 1958 |
| 2,937,270 | Atwood | May 17, 1960 |

UNITED STATES PATENT OFFICE
CERTIFICATE OF CORRECTION

Patent No. 3,042,800 July 3, 1962

Norman P. Gluth

It is hereby certified that error appears in the above numbered patent requiring correction and that the said Letters Patent should read as corrected below.

Column 1, line 23, for "decraese" read -- decrease --; line 34, for "desire dsignal" read -- desired signal --; line 72, for "components" read -- component --; column 2, line 37, for "illsutrating" read -- illustrating --; column 10, line 34, for "450° " read -- 45° --; column 11, line 24, for "tbe" read -- be --.

Signed and sealed this 18th day of December 1962.

(SEAL)
Attest:

ERNEST W. SWIDER
Attesting Officer

DAVID L. LADD
Commissioner of Patents